United States Patent [19]

Westra

[11] 4,267,503

[45] May 12, 1981

[54] METHOD AND INSTRUMENT FOR TESTING THE OPERATING CHARACTERISTICS OF A CAPACITOR

[76] Inventor: Marlin D. Westra, 730 S. Summit, Sioux Falls, S. Dak. 57104

[21] Appl. No.: 90,554

[22] Filed: Nov. 2, 1979

[51] Int. Cl.³ .................... G01R 11/52; G01R 27/26
[52] U.S. Cl. .................................................. 324/60 C
[58] Field of Search .............. 324/60 C, 60 CD, 60 R

[56] References Cited

U.S. PATENT DOCUMENTS 2,791,750  5/1957  Menzel et al. ..................... 324/60 C Primary Examiner—Stanley T. Krawczewicz
Attorney, Agent, or Firm—Edmond T. Patnaude

[57] ABSTRACT

Dielectric absorption in a capacitor is detected by making a first measurement of the capacitance of the capacitor, then charging the capacitor to its rated voltage, then discharging the capacitor, and then promptly making a second measurement of the capacitance of the capacitor. If the second measurement indicates a capacitance value less than that indicated by the first measurement, the capacitor exhibits dielectric absorption.

5 Claims, 3 Drawing Figures

METHOD AND INSTRUMENT FOR TESTING THE OPERATING CHARACTERISTICS OF A CAPACITOR

The present invention relates in general to the art of testing capacitors, and it relates in particular to a new and improved method and instrument for detecting dielectric absorption in a capacitor.

BACKGROUND OF THE INVENTION

Because of the many possible failures which may occur in a capacitor, the complete testing of capacitors has been a difficult task. However, the principal defects which occur in capacitors are change in capacitance, excessive leakage, breakdown at rated voltage, and dielectric absorption. These defects are most common in aluminum electrolytic capacitors because of the tendency for the dielectric material to dry out.

The most commonly used method for testing capacitors for these undesirable conditions involves the use of a bridge which can be used to measure capacitance and also to provide a dissipation factor. While such a measurement procedure may be suitable for laboratory use, it is too complicated and time consuming for use in trouble shooting electronic circuits such as television receivers, radios and the like.

Instruments for use in measuring capacitance by determining the time required for the capacitor to charge through a known resistance have been on the market, but they do not test for leakage, breakdown or dielectric absorption. However, these other defects are sufficiently common to warrant their consideration when trouble shooting circuits which include capacitors, and particularly aluminum electrolytic capacitors.

SUMMARY OF THE INVENTION

Briefly, there is provided in accordance with the present invention a new and improved method and apparatus for determining if a capacitor exhibits dielectric absorption. In keeping with this method the capacitance of the capacitor is measured after the capacitor has been discharged for at least several minutes. Then, a d.c. voltage at the rated value of the capacitor is applied to the capacitor. Preferably, although not necessarily, this is part of a leakage and/or break-down test. The capacitor is then discharged and the capacitance is again promptly measured. If the second measurement is less than the first measurement, the capacitor has dielectric absorption, and repeated capacitance measurements made over the next few minutes will show a gradual increase in the capacitance value measured until the initial measured value is reached.

In accordance with another aspect of the invention, an instrument for testing capacitors incorporates novel switching means which facilitates the successive steps of capacitance measuring, leakage testing, capacitor discharge and subsequent capacitance measuring.

GENERAL DESCRIPTION OF THE DRAWING

The present invention will be better understood by a reading of the following detailed description taken in connection with the accompanying drawing wherein:

FIG. 1 is a schematic circuit diagram of a capacitor tester embodying certain aspects of the invention; and FIGS. 2A and 2B are voltage wave forms useful in understanding the method of the invention and the operation of the circuit shown in FIG. 1.

DETAILED DESCRIPTION OF THE INVENTION

Dielectric absorption is a phenomenon that occurs in imperfect dielectrics when positive and negative charges are separated and subsequently accumulate in particular regions within the overall volume of the dielectric material. Dielectric absorption in a capacitor manifests itself as a gradually decreasing current after the application and subsequent removal of a constant direct voltage across the capacitor. Also, after a fully charged capacitor has been short circuited if the capacitor has dielectric absorption, it will act somewhat like a charged battery and will retain a small voltage across its electrodes for as long as several minutes. This battery-action gradually decreases as the positive and negative charges recombine and the voltage across the capacitor thus gradually decreases even with the short circuit removed.

This voltage which remains across the capacitor for a few minutes after the capacitor has been short circuited is very low, and therefore, it is inconvenient to detect dielectric absorption by a direct measurement of that voltage. In accordance with a preferred embodiment of this invention, the capacitance of the capacitor is measured by determining the time constant of a series RC circuit consisting of the capacitor under test and a known resistance value. Accordingly, even a small initial voltage across the capacitor will cause a substantial change in the measured time constant and thus in the capacitance value. Therefore, by making a first measurement of capacitance after the capacitor has been fully discharged for several minutes and then making a second measurement immediately after the capacitor has been fully charged and again discharged, a comparison of these two measured values will indicate the presence of dielectric absorption if the latter measurement is appreciably less than the first measurement. Moreover, if dielectric absorption is present, continued measurements will show a gradual increase in the apparent capacitance value.

Figure 1:
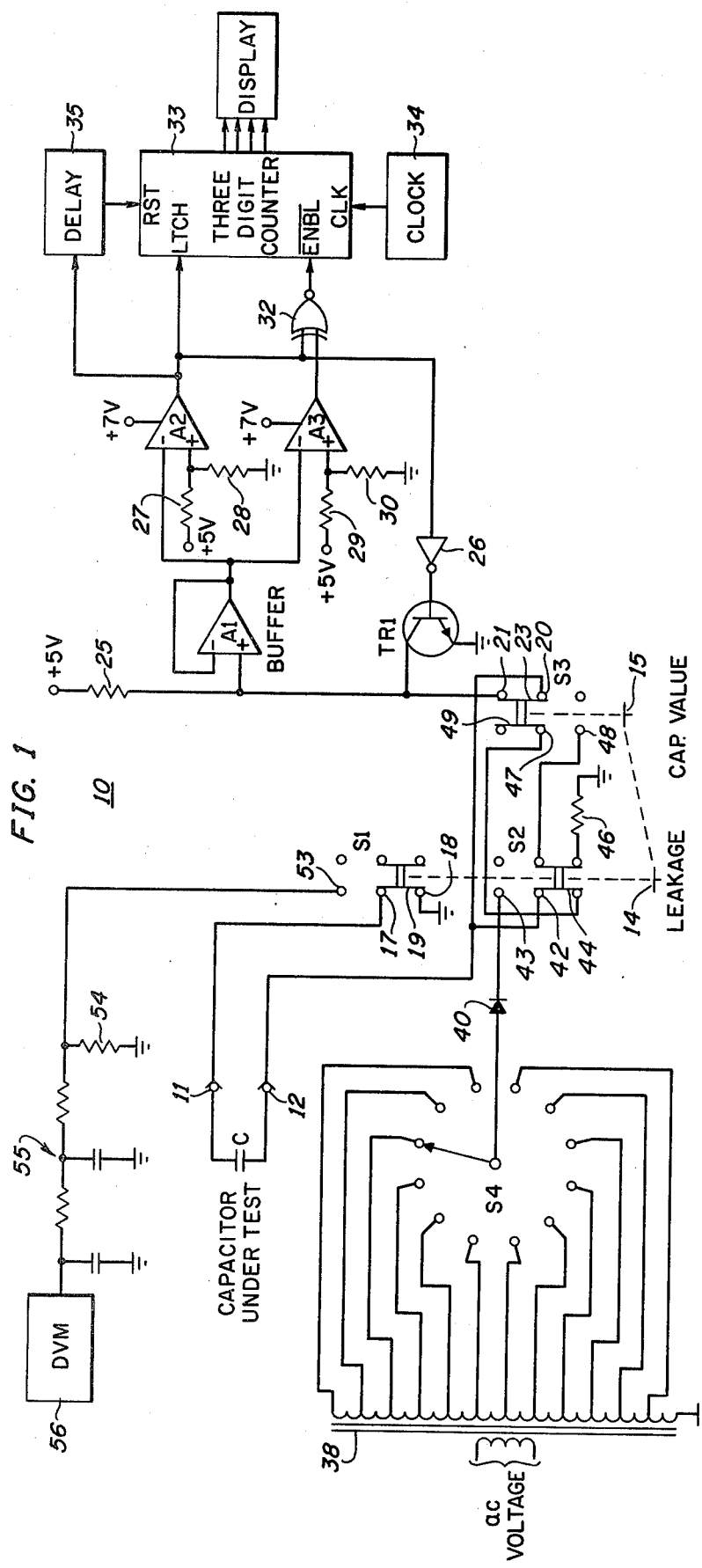

Referring now to FIG. 1 of the drawing, a capacitor testing circuit 10 includes a pair of input terminals 11 and 12 between which a capacitor C to be tested is adapted to be connected as shown. Switching means for selectively operating the test circuit in the capacitance measuring mode and in the leakage detection mode includes switch sections S1 and S2 ganged together for simultaneous operation by a push button actuator 14 and a switch section S3 operated by a push button actuator 15. Switches S1 and S2 are shown in the released positions and switch S3 is shown in the actuated position, these positions being for measuring the capacitance of the capacitor under test. The switches may be interconnected in any suitable manner as is well known in the art to prevent the simultaneous actuation of switch section S3 while switch sections S1 and S2 are actuated.

CAPACITANCE MEASURING MODE

With switches S1 and S2 in the normal, spring biased, released position as shown, input terminal 11 is connected to ground through contacts 17 and 18 and the wiper 19 of switch section S1. With switch section S3 in the actuated capacitance measuring position as shown, the input terminal 12 is connected through contacts 20 and 21 and the wiper 23 of switch section S3 to the collector of an NPN transistor TRI and through a resistor 25 to a source of positive direct voltage having a value, for example, of 5 volts. The emitter of the transistor is connected to ground and the base is connected via an inverter 26 to a source of voltage whose polarity depends on the output state of comparator A2, i.e., when the output of comparator A2 is low, TR1 will conduct.

When the switch S3 is initially actuated, the capacitor under test C begins to charge through the resistor 25, and the voltage across this capacitor is connected to the positive input terminal of a buffer amplifier A1. Hence, the output voltage of the amplifier A1 is an increasing positive voltage and, as shown, in connected to the negative input terminals of a pair of voltage comparator amplifiers A2 and A3. The positive input terminal of the amplifier A2 is connected to a voltage divider including resistors 27 and 28 and is held at 3.5 volts. Similarly the positive input of the amplifier A3 is 0.5 volts. Consequently, when the voltage across the capacitor C reaches 0.5 volts the output of amplifier A3 goes to ground or low.

The outputs of the amplifiers A2 and A3 are connected to the inputs of an exclusive NOR (coincidence) circuit 32. Therefore, when the output of the amplifier A3 goes low while the output of the amplifier A2 is high, the output of the exclusive NOR circuit goes low to enable a counter 33. When enabled, counter 33 commences to count clock pulses from a clock pulser 34.

When the voltage across the capacitor C reaches 3.5 volts, the amplifier A2 conducts, and its output also goes low. With both inputs to the exclusive NOR circuit low, its output goes high to disable the counter and interrupt the count. As shown, the output of the amplifier A2 is also connected to the latch input of the counter 33 and through a delay circuit 35 to the reset input of the counter 33. As a result, when the output of the amplifier A2 goes low, the count is displayed. The number of pulses counted may be seen to be directly related to the capacitance value of the capacitor C under test. Accordingly, the capacitance value is shown by the display.

Since the output of the amplifier A2 is also connected to the input of the inverter 26, when the amplifier A2 conducts the base of transistor TRI goes high and the transistor fires. The collector of the transistor momentarily drops to ground potential to short circuit the capacitor C and to turn off both amplifiers A2 and A3. Also, the low at the output of amplifier A2 resets the counter after a delay of sufficient duration to permit the amplifier A3 to return to its non-conductive state so that a zero will not be displayed. It may thus be seen that as long as the switch S3 is held in the actuated position, the capacitance value of the capacitor C will be repeatedly measured and the display continuously updated.

LEAKAGE MEASURING MODE

The leakage of a capacitor is the current flow which occurs through the dielectric of a fully charged capacitor while a constant direct voltage is applied across the electrodes. The extent of such leakage is commonly determined by connecting rated direct voltage across the capacitor under test and measuring the current through the capacitor after the capacitor has fully charged.

In order to measure the leakage of the capacitor C under test, the wiper of a rotary selector switch S4 is positioned to contact a selected tap on a transformer 38, to couple an ac voltage equal in value to the rated voltage of the capacitor under test to the positive terminal of a diode 40. Then the actuator 14 is actuated to move the wipers of the switch sections S1 and S2 to the upper positions. The switch section S3 will, of course, be in the lower released position (not shown) at that time. As a consequence, rectified half-wave voltage is coupled from the diode 40 through contacts 42 and 43 and wiper 44 of switch section S2 to input terminal 12 and thus to one side of the capacitor C. The other side of the capacitor C, which is connected to the input terminal 11, is connected via contacts 17 and 53 to one terminal of a resistor 54 whose other terminal is grounded. If the capacitor C exhibits any leakage, it will be manifested by a voltage across the resistor 54, and this voltage is coupled via a conventional RC filter 55 to the input of a voltmeter 56. Preferably the meter 56 is a digital voltmeter which drives the same display as does the counter 33. The resistor 54 should have a relatively low value so that the capacitor C is fully charged in a fraction of a second to prevent a display of the charging current. A resistor R46 is also of a low value and functions to discharge the capacitor C immediately after both switches S2 and S3 are returned to the released (out) position.

DIELECTRIC ABSORPTION DETECTION

When the actuator 14 is released at the completion of the leakage test, the capacitor C discharges through the resistor 46. This resistor must have a very low resistance of, for example, twenty-five ohms so that the capacitor C discharges in a fraction of a second. When, therefore, the actuator 15 is next operated to move the wipers 23 and 49 of the switch S3 to the illustrated positions, a good capacitor C will have been fully discharged. If however, the button 15 is actuated immediately after the actuator 14 is released, and if the capacitor under test has dielectric absorption, a small positive direct voltage will be present at the input terminal 12 and the capacitance value displayed will be less than the actual capacitance of the capacitor C under test.

Figure 2:
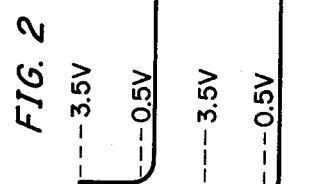

The reason for these apparently different capacitance values may be best understood by reference to the waveforms shown in FIGS. 2A and 2B. Waveform 2A shows the charging voltage across the capacitor C when there is no voltage across the capacitor when switch S3 is initially actuated. The voltage across the capacitor thus increases exponentially from zero and when the voltage reaches 0.5 volt, the counter 33 begins to count. The count terminates when the voltage reaches 3.5 volts. The count thus occurs during time $t_1$ as shown in FIG. 2. On the other hand, if there is an initial voltage across the capacitor, the charging voltage across the capacitor C will start at that initial voltage. Hence, as shown in FIG. 2B, it will increase from 0.5 volts to 3.5 volts in a time $t_2$. Since the time period of $t_2$ is less than that of $t_1$ the count displayed will be less. Moreover, if the actuator 15 is held in the depressed state for an extended period of time of say one minute, the displayed value of capacitance will slowly rise as the measurement continues to be updated automatically.

While the present invention has been described in connection with particular embodiments thereof, it will be understood by those skilled in the art that many changes and modifications may be made without departing from the true spirit and scope of the present invention. Therefore, it is intended by the appended claims to cover all such changes and modifications which come within the true spirit and scope of this invention.

I claim:

1. A method of determining if a capacitor has dielectric absorption, comprising the steps of
   measuring the capacitance of said capacitor,
   charging said capacitor to approximately its rated voltage, then
   discharging said capacitor, then
   again measuring the capacitance of said capacitor, and
   comparing the capacitance values indicated by said steps of measuring.

2. A method according to claim 1 wherein said steps of measuring the capacitance of said capacitor comprises
   connecting said capacitor in series with a resistance element across a source of unidirectional voltage, and
   determining the time required for the voltage across said capacitor to reach a predetermined value.

3. A method according to claim 1 comprising the further step of
   measuring the current to said capacitor during said step of charging said capacitor.

4. A method according to claim 3 wherein said step of measuring the capacitance of said capacitor comprises
   connecting said capacitor in series with a resistance element across a source of unidirectional voltage, and
   determining the time required for voltage across said capacitor to reach a predetermined value.

5. A instrument for determining if a capacitor under test exhibits dielectric absorption, comprising
   first circuit means for measuring and displaying the capacitance of a capacitor connected in circuit therewith,
   second circuit means for applying a rectified a.c. voltage across a capacitor connected in circuit therewith,
   switch means for connecting said capacitor under test in circuit with a selected one of said first and second circuit means, and means for discharging said capacitor when it is disconnected from said first circuit means,
   whereby a determination of whether said capacitor under test exhibits dielectric absorption can be made by operating said switch means to connect said capacitor in circuit with said first circuit means to measure the capacitance thereof, then operating said switch means to connect said capacitor in circuit with said second circuit means, then operating said switch means to discharge said capacitor, and then operating said switch means again to connect said capacitor in circuit with said first switch means, whereby a decrease in the measured value of capacitance between the first and second measurements provides an indication that said capacitor exhibits dielectric absorption.

* * * * *